United States Patent [19]

Gallichio

[11] Patent Number: 4,878,151
[45] Date of Patent: Oct. 31, 1989

[54] ANTI-PARALLEL CAPACITOR

[75] Inventor: Michael J. Gallichio, New Milford, Conn.

[73] Assignee: National Semiconductor Corporation, Sunnyvale, Calif.

[21] Appl. No.: 36,595

[22] Filed: Apr. 10, 1987

[51] Int. Cl.$^4$ .............................................. H01G 4/38
[52] U.S. Cl. ..................................................... 361/329
[58] Field of Search ............... 361/328, 329, 393, 409, 361/410, 330

[56] References Cited

U.S. PATENT DOCUMENTS

| 2,948,838 | 8/1960 | Obenhaus | 361/330 |
| 3,106,671 | 10/1963 | Coleman et al. | 361/330 |
| 3,321,683 | 5/1967 | Tatem | 361/330 X |
| 3,491,275 | 1/1970 | Puppolo et al. | 361/328 X |
| 4,628,405 | 12/1986 | Lippert | 361/321 |
| 4,731,696 | 3/1988 | Himes et al. | 361/313 |

FOREIGN PATENT DOCUMENTS 13414 8/1925 Netherlands ..................... 361/330

Primary Examiner—Donald A. Griffin
Attorney, Agent, or Firm—Limbach & Sutton Limbach

[57] ABSTRACT

A new and improved thin-film integrated capacitor having a low voltage coefficient and being comprised of two standard poly-metal capacitors which are connected in an anti-parallel fashion with the connecting poles of one of the poly-metal capacitors being connected to the reverse poles of the other poly-metal capacitor, thereby resulting in an integrated capacitor which has a constant voltage coefficient in a range approaching zero.

11 Claims, 1 Drawing Sheet

ELECTRICAL EQUIVALENT

ANTI-PARALLEL CAPACITOR

TECHNICAL FIELD

The invention relates in general to an improved capacitor for use in integrated circuits and in particular to an improved thin-film capacitor with an extremely low voltage coefficient which is desirable in integrated circuit design.

BACKGROUND OF THE INVENTION

There are two basic groups of capacitor structures available for use in integrated circuit design: junction and thin-film capacitors. This invention is concerned with the thin-film capacitor which is a direct miniaturization of the conventional parallel-plate capacitor.

The thin-film capacitor is composed of two conductive layers separated by a dielectric layer. Thin-film capacitors may be constructed using one of two processes: (a) MOS process using a metal-oxide semiconductor structure; or (b) using a thin-dielectric film between two conductive metal layers. The MOS structure is the most common thin-film capacitor in monolithic circuits because it is readily compatible with the conventional processing technology and does not require multiple metalization layers and is the process by which the capacitor is used in the present invention or fabricated. The capacitance output per unit area of a thin-film capacitor is equal to the ratio of the permittivity ($\epsilon_x$) to the thickness $T_x$ of a dielectric layer. An MOS capacitor has either silicon dioxide ($SiO_2$) or silicon nitride ($Si_3N_4$) which can be used as the dielectric layer. Although silicon dioxide is more readily available, silicon nitride is preferred whenever the extra processing steps can be justified, since it also has a high dielectric constant.

However, for a capacito to be viable in any environment, particularly the integrated circuit environment, it must have a voltage coefficient in the range of ±20 ppm across the voltage range of ±20 V with the reference capacitance being evaluated at 0 V with a dc bias. The voltage cofficient of a capacitor is the amount of change of capacitance for a given change in voltage. It is desirable that the voltage coefficient be constant at all times and be as close to 0 as possible; however, a coefficient in the range of ±20 ppm is a remarkable improvement over what was discovered to be the variable voltage coefficient for a standard poly-metal thin-film capacitor of the prior art.

It will be subsequently pointed out the voltage coefficient of the prior art standard poly-metal capacitors varied over a range of ±350 ppm when biased with a voltage over a range of ±20 V. This wide range of variability of the voltage coefficient is undesirable and unacceptable in the fabrication of integrated circuits.

SUMMARY OF THE INVENTION

In view of the current state of the MOS thin-film capacitor art problems still exist in trying to decrease the voltage coefficient of a capacitor and maintain it at a constant low voltage coefficient. It is evident that there is a need in the industry for a new and improved MOS thin-film capacitor which has a constant low voltage coefficient and which is in a range so close to zero that the effect of any variation in the voltage coefficient, if any, is negligible. Accordingly, the present invention comprises a new and improved thin-film capacitor which is fabricated using industry sandard MOS processing techniques and which results in a capacitor having an extremely low voltage coefficient which is constant across a range of ±20 V. This invention includes a capacitor which is comprised of two MOS type thin-film capacitors similarly constructed by which are electrically connected to each other in an anti-parallel fashion, i.e., the polarity of one capacitor is connected to the reverse polarity of the other capacitor.

Prior to realizing the effect of connecting two MOS-type capacitors in an anti-parallel fashion, it was determined that the rate of change of the voltage coefficient per volt of a single capacitor was approximately constant over the voltage range of ±20 V and that the voltage coefficient varied linearly with the increase in voltage over the relevant range.

By connecting two similar capacitors in an anti-parallel fashion, it was surprisingly realized that the change in capacitance of each capacitor as the applied dc bias is increased or decreased exactly cancels out the linear variation in the capacitance of each individual capacitor due to the reverse polarity of the applied voltage across the two capacitors. The voltage coefficient of such an anti-parallel capacitor pair is zero over the ±20 V range.

Additional benefits, advantages and characteristic features of my invention will become more apparent when the following figures are considered together with the detailed desccription of my invention wherein like reference numerals refer to like parts throughout the drawings.

Figure 1:
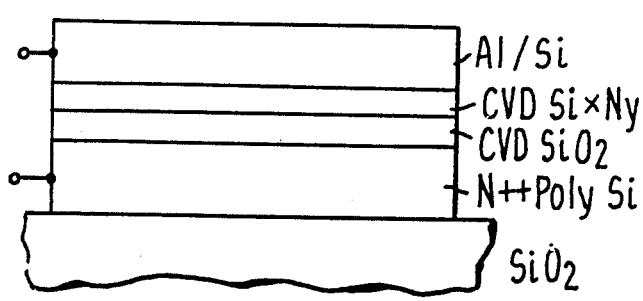
FIG. 1 is a partially schematic diagram of a thin-film capacitor of the type used in the present invention.

DETAILED DESCRIPTION OF THE INVENTION derived when a dc voltage between −20 V to +20 V was applied to the capacitor of FIG. 1:

TABLE 1

| Fo with open circuit - 471.3168 | | N+ Side VUM R2 HNN (−20 to +20) | |
|---|---|---|---|
| Vin = −20 | Fo = 276.3510 kHz | Ppm/V = −17.613 | Ppm = 352.263 |
| Vin = −18 | Fo = 276.3520 kHz | Ppm/V = −18.575 | Ppm = 334.351 |
| Vin = −16 | Fo = 276.3538 kHz | Ppm/V = −18.850 | Ppm = 301.602 |
| Vin = −14 | Fo = 276.3557 kHz | Ppm/V = −19.139 | Ppm = 267.948 |
| Vin = −12 | Fo = 276.3577 kHz | Ppm/V = −19.314 | Ppm = 231.762 |
| Vin = −10 | Fo = 276.3597 kHz | Ppm/V = −19.449 | Ppm = 194.491 |
| Vin = −8 | Fo = 276.3618 kHz | Ppm/V = −19.607 | Ppm = 156.858 |
| Vin = −6 | Fo = 276.3639 kHz | Ppm/V = −19.690 | Ppm = 118.141 |
| Vin = −4 | Fo = 276.3661 kHz | Ppm/V = −19.856 | Ppm = 79.423 |
| Vin = −2 | Fo = 276.3683 kHz | Ppm/V = −19.810 | Ppm = 39.621 |
| Vin = +0 | Fo = 276.3705 kHz | Ppm/V = −19.810* | Ppm = 0.000* |
| Vin = +2 | Fo = 276.3727 kHz | Ppm/V = −19.810 | Ppm = −39.620 |
| Vin = +4 | Fo = 276.3747 kHz | Ppm/V = −19.132 | Ppm = −76.527 |
| Vin = +6 | Fo = 276.3767 kHz | Ppm/V = −18.785 | Ppm = −112.709 |
| Vin = +8 | Fo = 276.3785 kHz | Ppm/V = −18.227 | Ppm = −145.816 |
| Vin = +10 | Fo = 276.3803 kHz | Ppm/V = −17.802 | Ppm = −178.017 |
| Vin = +12 | Fo = 276.3823 kHz | Ppm/V = −17.759 | Ppm = −213.113 |
| Vin = +14 | Fo = 276.3841 kHz | Ppm/V = −17.639 | Ppm = −246.942 |
| Vin = +16 | Fo = 276.3860 kHz | Ppm/V = −17.582 | Ppm = −281.313 |
| Vin = +18 | Fo = 276.3879 kHz | Ppm/V = −17.528 | Ppm = −315.504 |
| Vin = +20 | Fo = 276.3898 kHz | Ppm/V = −17.521 | Ppm = −350.417 |

*(Not actual value but an average of the preceeding and following values)

FIG. 1 illustrates the structure of each of the single capacitors 1 which are combined in an anti-parallel or reverse polarity fashion (see discussion of FIG. 5 and FIG. 6 below) to accomplish the remarkable results of the invention. Capacitor 1 is fabricated with two condctive plates 4 and 10 being successively deposited onto substrate 2 and with a dielectric layer comprised of layers 6 and 8 deposited between conductive plates 10 and 4. Here, the dielectric layer is comprised of a layer of silicon dioxide ($SiO_2$) and silicon nitride ($SiN_3$) but it may be comprised of either $SiO_2$ or $SiN_3$ alone. In composition, the dielectric layer comprises approximately 1000 Å of sioicon dioxide and approximately 1000 Å in this embodiment is comprised of approximately 1% silicon.

The capacitor 1 of FIG. 1 is fabricated in the standard MOS process with each of the successive layers being deposited onto the substrate 2 and with each of the successive layers being etched and patterned accordingly.

Figure 2:
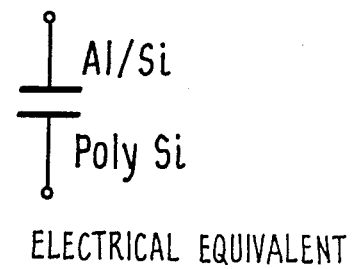
FIG. 2 is another schematic illustration of the thin-film capacitor of FIG. 1 illustrating the two conductive plates only.

FIG. 2 is a further schematic illustration of the top and bottom conductive plates of capacitor 1 in FIG. 1. The bottom electrode 4 and the top electrode 10 are illustratd with the dielectric layer being omitted in this illustration. As previously pointed out, the dielectric layer which is illustrated in FIG. 1 as layers 6 and 8 and which will be between plates 4 and 10 of FIG. 2 when the capacitor is fabricated may be a single insulated layer such as silicon dioxide or silicon nitride or may be combination of the two layers as is illustrated in FIG. 1. The capacitors illustrated in FIG. 1 and 2 are the standard form poly-metal capacitors.

Figure 3:
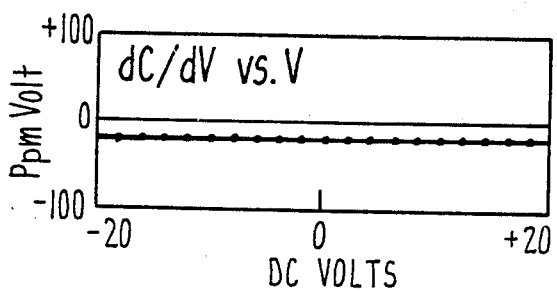
FIG. 3 is a graphic illustration plotting the change in capacitance over the change in voltage (dC/dV) against the dc voltage (V) over a range of ±20 V to illustrate the variation in the voltage coefficient of a single standard MOS capacitor with the construction of FIG. 1.

When capacitor 1 was biased with a dc voltage over a range of −20 V to +20 V and with the reference capacitors being evaluated at 0 V, it was determined that the voltage coefficient of the capacitor varied linearly as a voltage within the relevant range was being applied to the capacitor 1. That is, it was observed that the rate of change of the voltage coefficient per volt had an approximately constant variaility over the voltage range of ±20 V. for example, the following data was FIG. 3 illustrates that based on the above data derived from applying a voltage in the range of ±20 V to the capacitor of FIG. 1, the ratio of the change in capacitance to the change in voltage being applied was constant. That is, the change of the voltage coefficient of the capacitance 1 in FIG. 1 was constant although it varied substantially from 0 ppm.

Figure 4:
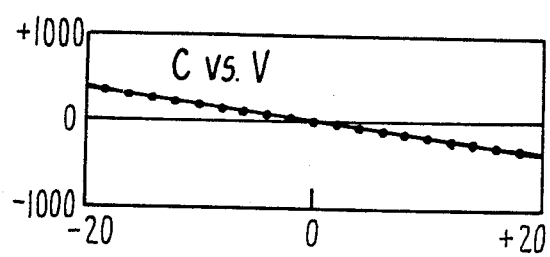
FIG. 4 is another graphic illustration of the same data generated from the same capacitor of FIG. 3 but plotting the capacitance (C) against the voltage (V) within the range of ±20 V.

The FIG. 4 graph illustrates how the capacitance varies linearly to the voltage being applied across the capacitor of FIG. 1. The data to derive this graph was taken from Table 1.

Upon realizing that the ratio of the change in the capacitance over the change in the voltage of capacitor 1 is constant over a voltage range of ±20 V (dc), and that the capacitance varies linearly with the voltage being applied to capacitor 1, it was determined that the capacitor in FIG. 1 could be incorporated into an embodiment which could possibly result in a capacitor with an extremely low voltage coefficient which would be very close to the range of 0 over a dc bias of ±20 V.

Figure 5:
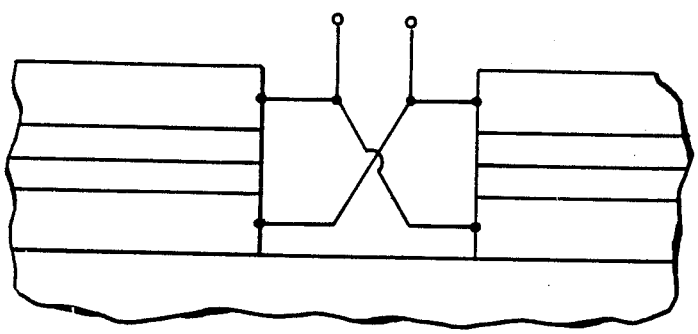
FIG. 5 is a schematic diagram of the invention illustrating two identical capacitors with the structure illustrated in FIG. 1 and which capacitors are connected in an anti-parallel fashion.

FIG. 5 illustrates one embodiment of the invention in which two capacitors 16 and 18, fabricated in the same manner as capacitor 1 of FIG. 1, are connected to each other in an anti-parallel fashion. That is, electrical contact 20 of capacitor 16 is connected to contact 26 of capacitor 18 and electrical contact 22 of capacitor 16 is connected to contact 24 of capacitor 18.

In order to illustrate that capacitor 16 and 18 of FIG. 5 are fabricated in the same manner as capacitor 1 of FIG. 1, the respective layers of capacitors 16 and 18have been given the same reference numeral designations as in FIG. 1 but with subscripts a and b.

Figure 6:
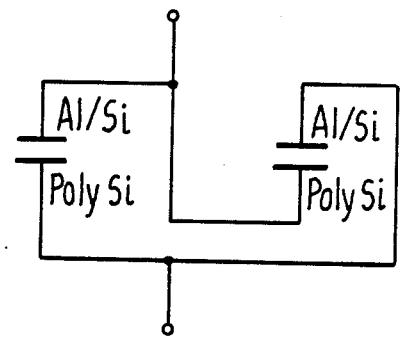
FIG. 6 is a partially schematic illustration of the two thin-film capacitors of FIG. 5 but illustrating only the two conductive plates of each capacitor and the anti-parallel connection of the two capacitors.

FIG. 6 is a further schematic illustration of how capacitors 16 and 18 of FIG. 5 are electrically connected in order to result in a capacitor with a low voltage coefficient which is in the range of 0 ppm.

When the capacitor illustrated in FIG. 5 was tested to determine the voltage coefficient over a range of ±20 V (dc bias) being applied across the capacitor, the resulting data indicated that the voltage coefficient was close to 0 (FIG. 8) and that the ratio of the change in the capacitance over the change in the voltage being applied was thus close to 0. The following table illustrates the remarkable results of this experiment.

TABLE 2

| Fo with open circuit - 471.2299 | | N+ Side VUM R2 HNN (−20 to +20) | |
|---|---|---|---|
| Vin = −20 | Fo = 250.2016 kHz | Ppm/V = 1.159 | Ppm = .181 |
| Vin = −18 | Fo = 250.2018 kHz | Ppm/V = 1.588 | Ppm = −28.577 |
| Vin = −16 | Fo = 250.2015 kHz | Ppm/V = 1.374 | Ppm = −21.982 |
| Vin = −14 | Fo = 250.2012 kHz | Ppm/V = 1.099 | Ppm = −15.388 |
| Vin = −12 | Fo = 250.2009 kHz | Ppm/V = .899 | Ppm = −10.791 |
| Vin = −10 | Fo = 250.2008 kHz | Ppm/V = .799 | Ppm = −7.994 |
| Vin = −8 | Fo = 250.2007 kHz | Ppm/V = .774 | Ppm = −6.195 |
| Vin = −6 | Fo = 250.2006 kHz | Ppm/V = .799 | Ppm = −4.796 |
| Vin = −4 | Fo = 250.2006 kHz | Ppm/V = 1.049 | Ppm = −4.197 |
| Vin = −2 | Fo = 250.2005 kHz | Ppm/V = .799 | Ppm = −1.599 |
| Vin = +0 | Fo = 250.2004 kHz | Ppm/V = 1.049* | Ppm = .500* |
| Vin = +2 | Fo = 250.2003 kHz | Ppm/V = 1.299 | Ppm = 2.598 |
| Vin = +4 | Fo = 250.2002 kHz | Ppm/V = 1.249 | Ppm = 4.996 |
| Vin = +6 | Fo = 250.2000 kHz | Ppm/V = 1.232 | Ppm = 7.394 |
| Vin = +8 | Fo = 250.1999 kHz | Ppm/V = 1.349 | Ppm = 10.791 |
| Vin = +10 | Fo = 250.1998 kHz | Ppm/V = 1.139 | Ppm = 11.391 |
| Vin = +12 | Fo = 250.1998 kHz | Ppm/V = 1.066 | Ppm = 12.790 |
| Vin = +14 | Fo = 250.1999 kHz | Ppm/V = .771 | Ppm = 10.791 |
| Vin = +16 | Fo = 250.2000 kHz | Ppm/V = .562 | Ppm = 8.993 |
| Vin = +18 | Fo = 250.2001 kHz | Ppm/V = .322 | Ppm = 5.795 |
| Vin = +20 | Fo = 250.2003 kHz | Ppm/V = .140 | Ppm = 2.798 |

*(Not actual value but an average of the preceeding and following values)

Figure 7:
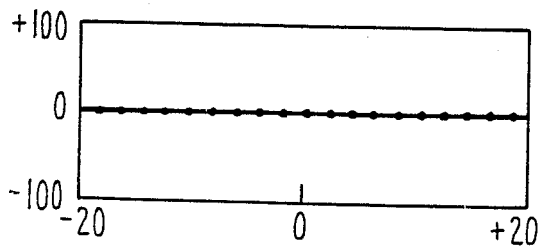
FIG. 7 is a graphic illustration of the change in capacitance over the change in voltage plotted against the voltage being applied to the capacitor structure of FIG. 5 and illustrating the constant voltage coefficient of the capacitor constructed in accordance with the invention.
Figure 8:
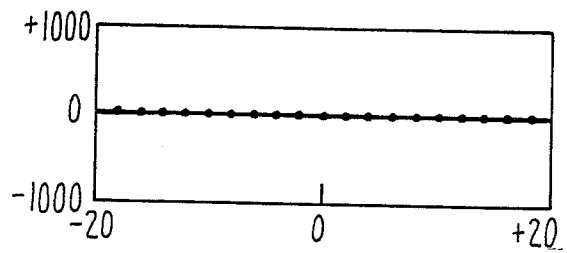
FIG. 8 is another graphic illustration of the capacitor illustrated in FIG. 5 plotting the capacitance against the voltage over a range of ±20 V.

When the data resulting from Table 2 was plotted to determine the voltage coefficient of the capacitor in FIG. 5, it was determined that the voltage coefficient was not only constant but was close to 0. This result is illustrated in FIG. 7 and 8. The graphs of FIG. 7 and 8 were generated from the data in Table 2.

This invention has been described with respect to specific embodiments, such as whether dielectric layers comprise of two layers of silicon dioxide and silicon nitrite, but it must be understood that this invention is intended to cover any and all embodiments and equivalents which are within the scope of the appended claims. This invention is therefore limited only by the appended claims.

I claim:

1. A capacitor having a low voltage coefficient comprising:
   a first capacitor having a first contact, a second contact and a polarity therebetween;
   a second capacitor having a first contact, a second contact and a like polarity therebetween;
   and wherein said first contact of said first capacitor is connected to said second contact of said second capacitor and said second contact of said first capacitor is connected to the first contact of the second capacitor.

2. A low voltage coefficient capacitor as defined in claim 1 wherein each of said first and second capacitors has a first and a second conductor plate deposited on a silicon substrat with a dielectric layer deposited between said conductor plates.

3. The capacitor as defined in claim 2 wherein said first conductor plate of each of said first and second capacitors is a polysilicon layer and said second conductor plate of each capacitor is a metal layer.

4. The capacitor as defined in claim 3 wherein the capacitance of each of said first and second capacitors varies in a substantially lineara fashion as the voltage being applied across said first and second capacitors changes.

5. The capacitor of claim 4 wherein the voltage coefficient of said capacitor is substantially constant in a range between −30 ppm and +12 ppm as the voltage being applied across said first and second capacitors varies between ±20 V.

6. A low voltage coefficient capacitor as defined in claim 1 wherein each of said first and second capacitors has a series of layers sequentially deposited on a silicon substrate with a silicon dioxide layer being first deposited thereon, followed by the deposition of a heavily doped polysilicon layer, followed by the deposition of a dielectric layer and then a metal layer.

7. The capacitor as defined in claim 6 wherein the capacitance of each of said first and second capacitors varies linearly as the voltage being applied across said first and second capacitors changes.

8. A capacitor having a low voltage coefficient comprising:
   a first and a second capacitor each having a series of layers sequentially deposited on a silicon substrate with a silicon dioxide layer being first deposited on said substrate, followed by the deposition of a first conductor layer,
   followed by the deposition of an insulator layer and than a second conductor layer;
   said first capacitor further has a first contact, a second contact and a like polarity therebetween; and
   wherein said first contact of said first capacitor is connected to said second contact of said second capacitor and said second contact of said first capacitor is connected to said first contact of said second capacitor.

9. The capacitor as defined in claim 8 wherein said first conductor plate of each of said first and second capacitors is polysilicon and the second conductor plate of each of said first and second capacitors is alumina silicon.

10. The capacitor as defined in claim 8 wherein the capacitance of each of said first and second capacitors varies in a substantially linear fashion as the voltage being applied across said first and second capacitors is varied.

11. The capacitor of claim 8 wherein the voltage coefficient of said capacitor is substantially constant in a range between −30 ppm and +12 ppm as the voltage being applied to said first and second capacitors varies between ±20 V.

* * * * *

UNITED STATES PATENT AND TRADEMARK OFFICE
CERTIFICATE OF CORRECTION

PATENT NO. : 4,878,151

DATED : October 31, 1989

INVENTOR(S): Michael J. Gallichio

It is certified that error appears in the above-identified patent and that said Letters Patent is hereby corrected as shown below:

In Col. 1, Line 37, replace "capacito" with --capacitor--.

In Col. 1, Line 42, replace "cofficient" with --coefficient--.

In Col. 1, Line 69, replace "sandard" with --standard--.

In Col. 2, Line 6, replace "by" with --but--.

In Col. 3, Lines 32 and 33, replace "condctive" with --conductive--.

In Col. 3, Line 40, replace "sioicon" with --silicon--.

In Col. 3, Line 40, before "in" insert --of silicon nitride. The top electrode plate 10--.

In Col. 3, Line 51, replace "illustratd" with --illustrated--.

In Col. 3, Line 67, replace "variaility" with --variability--.

In Col. 3, Line 69, replace "for" with --For--.

In Claim 2, Col. 5, Line 54, replace "substrat" with --substrate--.

UNITED STATES PATENT AND TRADEMARK OFFICE
CERTIFICATE OF CORRECTION

PATENT NO. : 4,878,151

DATED : October 31, 1989

INVENTOR(S) : Michael J. Gallichio

It is certified that error appears in the above-identified patent and that said Letters Patent is hereby corrected as shown below:

In Claim 9, Col. 6, Line 55, replace "alumina" with --aluminum--.

Signed and Sealed this

Sixteenth Day of October, 1990

*Attest:*

HARRY F. MANBECK, JR.

*Attesting Officer*  *Commissioner of Patents and Trademarks*